(12) United States Patent
Delight et al.

(10) Patent No.: US 6,795,006 B1
(45) Date of Patent: Sep. 21, 2004

(54) INTEGRATOR RESET MECHANISM

(75) Inventors: Guy Delight, Escondido, CA (US); Remi LeReverend, San Diego, CA (US)

(73) Assignee: Zarlink Semiconductor AB, Jarfalla (SE)

( * ) Notice: Subject to any disclaimer, the term of this patent is extended or adjusted under 35 U.S.C. 154(b) by 0 days.

(21) Appl. No.: 10/622,991

(22) Filed: Jul. 18, 2003

(51) Int. Cl.[7] .............................................. H03M 3/00
(52) U.S. Cl. ..................... 341/143; 341/172; 327/336; 327/554
(58) Field of Search ................... 341/143, 172; 327/336, 554

(56) References Cited

U.S. PATENT DOCUMENTS

| | | | |
|---|---|---|---|
| 6,061,009 A | 5/2000 | Krone et al. | |
| 6,194,946 B1 * | 2/2001 | Fowers | 327/337 |
| 6,362,763 B1 | 3/2002 | Wang | |
| 6,661,283 B1 * | 12/2003 | Lee | 330/9 |
| 2002/0135402 A1 * | 9/2002 | Miyabe et al. | 327/94 |

* cited by examiner

Primary Examiner—Howard L. Williams
(74) Attorney, Agent, or Firm—Knobbe Martens Olson & Bear LLP

(57) ABSTRACT

An integrator with a reset mechanism comprises an integration capacitor and a replacement integration capacitor, wherein the integration capacitor is replaced with the replacement integration capacitor during a reset operation. A method of resetting an integrator comprises temporarily removing an integration capacitor and replacing the integration capacitor with a reset capacitor during a reset operation of the integrator. The method may further comprise temporarily removing the integration capacitor and replacing it with a reset capacitor multiple times during a single reset operation of the integrator.

13 Claims, 3 Drawing Sheets

INTEGRATOR RESET MECHANISM

BACKGROUND OF THE INVENTION

1. Field of the Invention

The present invention relates generally to integrator circuits, and more particularly to reset mechanisms for differential integrator circuits.

2. Description of the Related Art

Integrator circuits are widely used in electronic circuits for a multitude of applications. In some applications, the integrators are part of a loop that can become unstable and need to be reset so that the circuit can function normally again. For example, delta-sigma modulators are commonly used in oversampling analog to digital (A/D) converters, where the delta-sigma modulator is typically of a high order and comprises a plurality of integration stages as illustrated in FIG. 1. Some conditionally stable single loop high order delta-sigma modulators need to be reset when an unstable condition occurs, where the state variables of the modulator need to be reset to values within a stable state, such as zero, by resetting the integrators in the modulator.

The conventional method of resetting an integrator is illustrated in FIG. 2. The integration circuit of FIG. 2 comprises a differential operational amplifier (op-amp) having inverting and non-inverting inputs and inverting and non-inverting outputs. A first integration capacitor is coupled between the inverting input and non-inverting output, and a second integration capacitor is coupled between the non-inverting input and the inverting output. The integration circuit also includes a first reset switch coupled in parallel to the first integration capacitor, and a second reset switch coupled in parallel with the second integration capacitor. In operation of the integration circuit of FIG. 2, the integrator is reset to a stable state by closing the first and second reset switches, thereby short-circuiting the first and second integration capacitors.

The conventional method of resetting integrators, as illustrated in FIG. 2, however, has many disadvantages. For example, upon completion of a reset operation the common mode voltage of the input state is the same as the common mode voltage of the output stage. For some op-amp topologies, the input common mode voltage of the op-amp is designed to be different than the output common mode voltage for the op-amp to operate properly. For such an op-amp structure, additional cycles of operation of the integrator may be required after reset for the input common mode voltage to attain a value for proper operation.

Thus, additional methods and circuit implementations for resetting integrator circuits are needed in the technology.

SUMMARY OF THE INVENTION

In one aspect of the invention, an integrator circuit with a reset mechanism comprises an integration capacitor, a reset capacitor, a first integration switch coupled between an input of the integrator and an input side of the integration capacitor, a second integration switch coupled between an output side of the integration capacitor and an output of the integrator, a third integration switch coupled between an input common mode voltage and an input side of the reset capacitor, and a fourth integration switch coupled between an output side of the reset capacitor and an output common mode voltage. The integrator circuit further comprises a first reset switch coupled between the input of the integrator and the input side of the reset capacitor, a second reset switch coupled between the output side of the reset capacitor and the output of the integrator, a third reset switch coupled between the input common mode voltage and the input side of the integration capacitor, and a fourth reset switch coupled between the output side of the integration capacitor and the output common mode voltage, wherein the integration switches are closed during an integration mode and open during a reset mode, and wherein the reset switches are closed during the reset mode and open during the integration mode.

In another aspect of the invention, an integrator with a reset mechanism comprises a replacement integration capacitor which replaces an integration capacitor during a reset mode of the integrator. In a further aspect of the invention, the integration capacitor is charged to a predefined voltage during the reset mode.

In an additional aspect of the invention, a method of resetting an integrator comprises temporarily removing an integration capacitor and replacing the integration capacitor with a reset capacitor during a reset operation of the integrator. The method can further comprise charging the integration capacitor to a predefined voltage during the reset operation. In a further aspect of the invention, temporarily removing the integration capacitor and replacing the integration capacitor with the reset capacitor is repeated one or more times.

Another aspect of the invention is a delta-sigma modulator having a plurality of integration stages, wherein at least one of the integration stages comprises a first capacitor for integration and a second capacitor to replace the first capacitor in resetting the at least one integration stage.

In yet another aspect of the invention, a differential integrator comprises a pair of normal integration capacitors and a pair of reset integration capacitors, wherein the normal integration capacitors are rotated out of the integrator and the reset integration capacitors are rotated into the integrator to reset the integrator.

In an additional aspect of the invention, a circuit for resetting a state variable output of an integrator comprises a plurality of integration switches, wherein the integrator operates in a normal mode when the plurality of integration switches are closed, a plurality of reset switches, wherein the plurality of reset switches are open when the plurality of integration switches are closed, and at least one reset capacitor, wherein the reset capacitor replaces an integration capacitor between an input and an output of the integrator when the plurality of reset switches are closed and the plurality of integration switches are open.

An additional aspect of the invention is a digital microphone, comprising a circuit for resetting a state variable output of at least one integrator, wherein the at least one integrator comprises a first capacitor for integration and a second capacitor to replace the first capacitor in resetting the at least one integrator.

Yet another aspect of the invention is a microphone, comprising a transducer, a delta-sigma modulator coupled to the transducer, and means for maintaining the delta-sigma modulator in a stable state. The means for maintaining the delta-sigma modulator in a stable state can comprise a circuit for resetting a state variable output of an integrator of the delta-sigma modulator, comprising a plurality of integration switches, wherein the integrator operates in a normal mode when the plurality of integration switches are closed, a plurality of reset switches, wherein the plurality of reset switches are open when the plurality of integration switches are closed, and at least one reset capacitor, wherein the reset capacitor replaces an integration capacitor between an input and an output of the integrator when the plurality of reset switches are closed and the plurality of integration switches are open. The means for maintaining the delta-sigma modulator in a stable state can further comprise a limiter, coupled between the transducer and the delta-sigma modulator.

DETAILED DESCRIPTION OF THE PREFERRED EMBODIMENT

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Embodiments of the invention comprise methods for resetting op-amp integrator circuits to a stable state and integrator circuits implementing such methods, where the methods described can be implemented for both singular and differential integrator structures. Furthermore, methods and circuits according to the invention can advantageously be implemented in a high order delta-sigma modulator comprising a plurality of integrators. In one embodiment, a method of resetting an integrator comprises temporarily removing an integration capacitor from the integrator and replacing it with a reset capacitor. While removed from the integrator, the integration capacitor is charged to a desired voltage, and then rotated back into the integrator for stable operation. This rotation may be repeated several times to attain the desired reset voltage for the integrator circuit components and corresponding stable integrator state.

Figure 1:
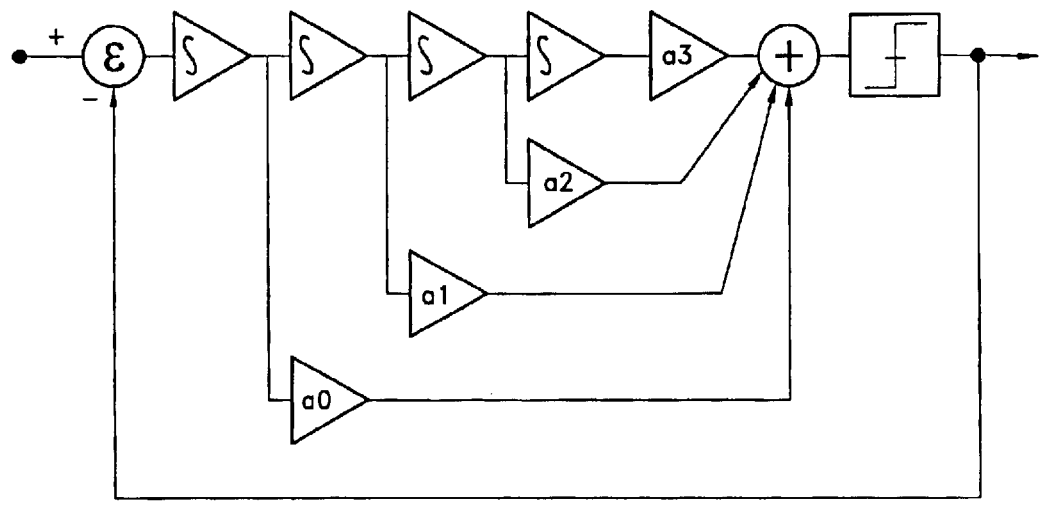
FIG. 1 is a schematic block diagram of a delta-sigma modulator.
Figure 2:
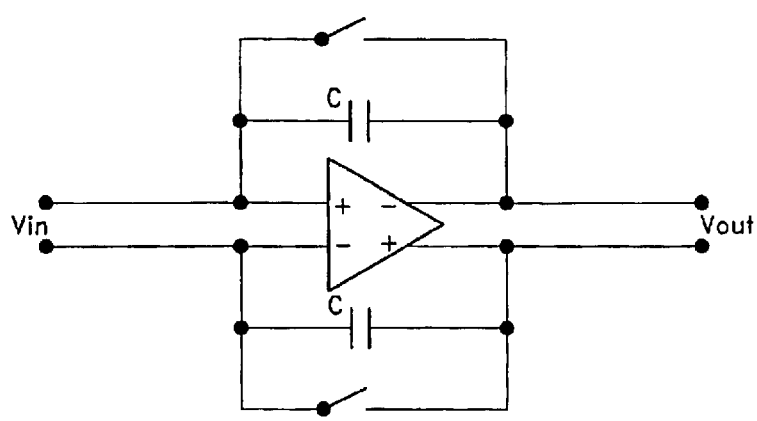
FIG. 2 is a schematic block diagram of an integrator circuit with a reset mechanism of the prior art.
Figure 3:
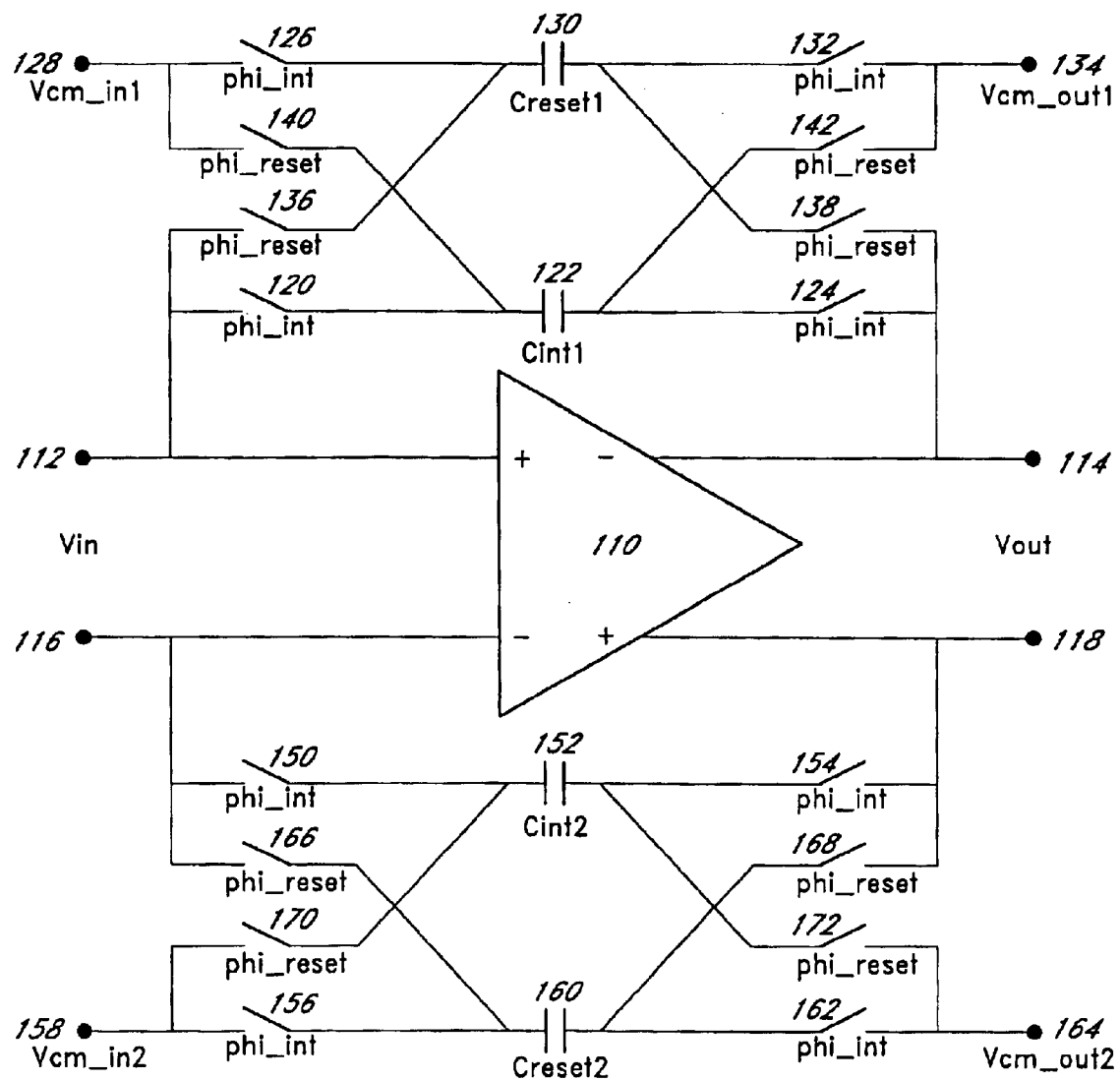
FIG. 3 is a schematic block diagram of one embodiment of an integrator circuit with a reset mechanism of the invention.

One embodiment of an integrator circuit 100 implementing a reset mechanism is illustrated in FIG. 3. The integrator circuit 100 has a differential structure, wherein the circuit 100 comprises an op-amp 110 with a first input 112, a first output 114, a second input 116, and a second output 118. An input signal (Vin) is provided across the input of the op-amp 110 at the first input 112 and second input 116, and an output signal (Vout) is produced across the output of the op-amp at the first output 114 and second output 118 in response to the input signal Vin.

The integrator circuit 100 further comprises a first integration switch 120 coupled between the first input 112 and a first integration capacitor 122, and a second integration switch 124 is coupled between the first integration capacitor 122 and the first output 114 of the op-amp 110. A third integration switch 126 is coupled between a first input common mode voltage (Vcm_in1) 128 and a first reset capacitor 130, and a fourth integration switch 132 is coupled between the first reset capacitor 130 and a first output common mode voltage (Vcm_out1) 134.

The integrator circuit 100 additionally comprises a first reset switch 136 coupled between the first input 112 of the op-amp 110 and the first reset capacitor 130, a second reset switch 138 coupled between the first reset capacitor 130 and the first output 114 of the op-amp 110, a third reset switch 140 coupled between the first input common mode voltage 128 and the first integration capacitor 122, and a fourth reset switch 142 coupled between the first integration capacitor 122 and the first output common mode voltage 134.

Similarly, a fifth integration switch 150 is coupled between the second input 116 and a second integration capacitor 152, and a sixth integration switch 154 is coupled between the second integration capacitor 152 and the second output 118 of the op-amp 110. A seventh integration switch 156 is coupled between a second input common mode voltage (Vcm_in2) 158 and a second reset capacitor 160, and an eighth integration switch 162 is coupled between the second reset capacitor 160 and a second output common mode voltage (Vcm_out1) 164.

In addition, a fifth reset switch 166 is coupled between the second input 116 of the op-amp 110 and the second reset capacitor 160, a sixth reset switch 168 is coupled between the second reset capacitor 160 and the second output 118 of the op-amp 110, a seventh reset switch 170 is coupled between the second input common mode voltage 158 and the second integration capacitor 152, and an eighth reset switch 172 is coupled between the second integration capacitor 152 and the second output common mode voltage 164.

During an integrate or normal operation of the integrator circuit 100, the integration switches 120, 124, 126, 132, 150, 154, 156, 162 are closed and the reset switches 136, 138, 140, 142, 166, 168, 170, 172 are open, such that the first integration capacitor 122 is coupled between the first input 112 and the first output 114 of the op-amp 110, the second integration capacitor 152 is coupled between the second input 116 and the second output 118 of the op-amp 110, the first reset capacitor 130 is coupled between the first input common mode voltage 128 and the first output common mode voltage 134, and the second reset capacitor 160 is coupled between the second input common mode voltage 158 and the second output common mode voltage 164.

During a reset operation of the integrator circuit 100, the reset switches 136, 138, 140, 142, 166, 168, 170, 172 are closed and the integration switches 120, 124, 126, 132, 150, 154, 156, 162 are open, such that the first reset capacitor 130 is coupled between the first input 112 and the first output 114 of the op-amp 110, the second reset capacitor 160 is coupled between the second input 116 and the second output 118 of the op-amp 110, the first integration capacitor 122 is coupled between the first input common mode voltage 128 and the first output common mode voltage 134, and the second integration capacitor 152 is coupled between the second input common mode voltage 158 and the second output common mode voltage 164.

Thus, during a reset operation the integration capacitors are removed from the integrator and charged to a desired voltage, and then rotated back into the integrator. When the reset capacitors are rotated into the integrator they provide charge to additional capacitors coupled to the op-amp, at the inputs and outputs of the op-amp, for example, such that the voltage levels across the capacitors approach a desired reset value. Furthermore, replacement of the integration capacitor with a reset capacitor during a reset operation prevents the op-amp from operating in an open loop condition and subsequently driving its outputs to the power supply rails.

Figure 4:
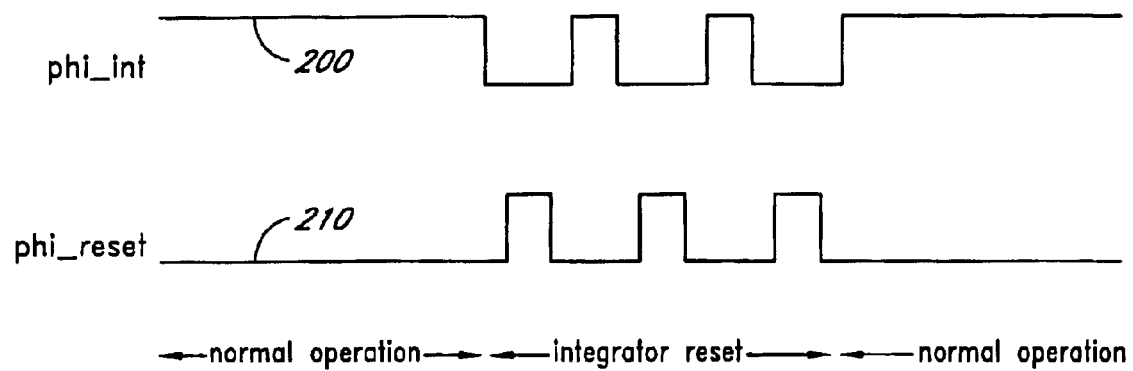
FIG. 4 is a timing diagram for use with the integrator circuit of FIG. 3.

In one embodiment of a method of resetting the integrator of FIG. 3, the integration capacitors 122, 152 are rotated out of the integrator and replaced with the reset capacitors 130, 160 multiple times during a single reset operation. The reset switches and integration switches are clocked with non-overlapping clocks as illustrated in the timing diagram of FIG. 4, where the integration switches are closed when an integration clock signal 200 is high and open when the integration clock signal 200 is low, and where the reset switches are open when a reset clock signal 210 is low and closed when the reset clock signal 210 is high. Thus, the integration capacitors are rotated out of the integrator and replaced with the reset capacitors multiple times during a reset operation by applying a number of pulses to the reset switches, non-overlapping with the clock signal applied to the integration switches.

As large valued capacitors typically occupy significant space on integrated circuits, implementations of the reset mechanism described herein where a smaller valued reset capacitor is used can be advantageous. For example, by rotating the reset capacitor into and out of the integrator multiple times, as described above, the size of the reset capacitor can be reduced and the same reset voltages attained as compared with the use of a larger reset capacitor rotated into the integrator for the entire duration of a reset operation. In addition, the number and frequency of reset pulses applied to the reset switches can be varied depending on integrator characteristics and capacitor sizes so as to optimally adjust the operation of the reset mechanism.

Figure 5:
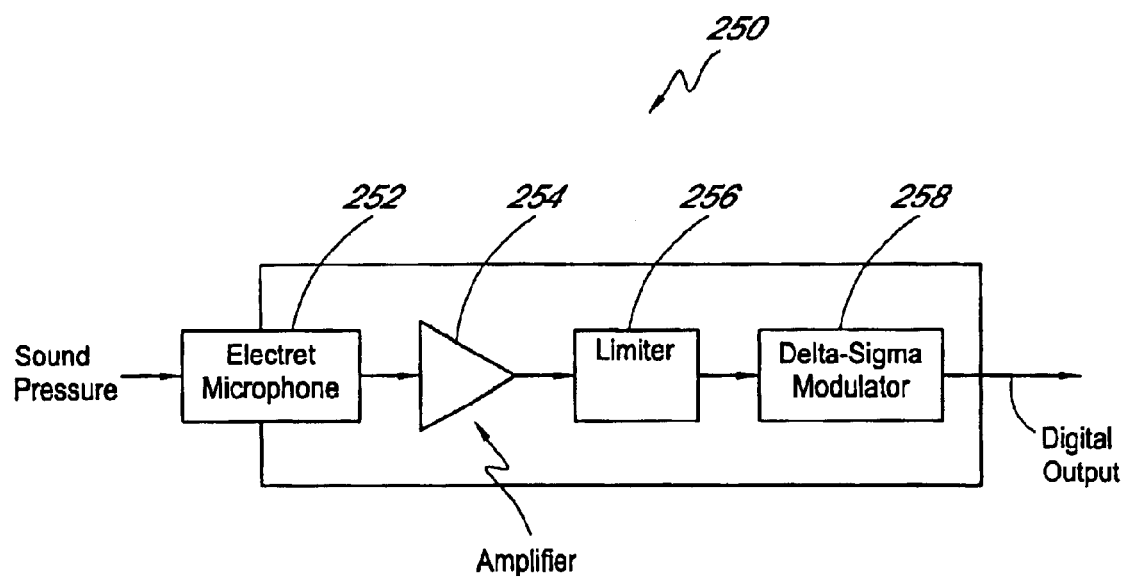
FIG. 5 is a block diagram of a digital microphone.

The integrator reset mechanism described above can advantageously be implemented in a delta-sigma modulator of a digital microphone. FIG. 5 is an exemplary block diagram of a digital microphone 250 comprising an electret microphone 252, which is coupled through an amplifier 254 to a limiter 256, and the output of the limiter 256 is coupled to a delta-sigma modulator 258. Sound pressure is converted to an analog signal by the electret microphone transducer, and the analog signal is amplified by the amplifier 254. The amplified signal is limited by the limiter 256 to maintain stability of the delta-sigma modulator 258, which converts the limited signal to a digital signal. As discussed above, some conditionally stable delta-sigma modulators can become unstable under certain conditions. Limiting the amplitude of the signal provided to the delta-sigma modulator reduces the likelihood of an unstable condition occurring in the modulator, however, as unstable conditions can still occur, the additional implementation of the above-described integrator reset mechanism can be advantageous to reset the integrator values of the modulator to a stable state. Alternately, the limiter can be removed and stability can be maintained by the integrator reset mechanism in the delta-sigma modulator.

The foregoing description details certain embodiments of the invention. It will be appreciated, however, that no matter how detailed the foregoing appears in text, the invention can be practiced in many ways. For example, the above described integrator reset method can also be implemented in a circuit having a capacitor that needs to be set to a particular voltage but cannot be removed from the circuit for extended length of time. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. An integrator circuit with a reset mechanism, comprising:
   an integration capacitor;
   a reset capacitor;
   a first integration switch coupled between an input of said integrator and an input side of said integration capacitor;
   a second integration switch coupled between an output side of said integration capacitor and an output of said integrator;
   a third integration switch coupled between an input common mode voltage and an input side of said reset capacitor;
   a fourth integration switch coupled between an output side of said reset capacitor and an output common mode voltage;
   a first reset switch coupled between said input of said integrator and said input side of said reset capacitor,
   a second reset switch coupled between said output side of said reset capacitor and said output of said integrator;
   a third reset switch coupled between said input common mode voltage and said input side of said integration capacitor; and
   a fourth reset switch coupled between said output side of said integration capacitor and said output common mode voltage, wherein said integration switches are closed during an integration mode and open during a reset mode, and wherein said reset switches are closed during said reset mode and open during said integration mode.

2. An integrator with a reset mechanism, comprising a replacement integration capacitor which replaces an integration capacitor during a reset mode of the integrator.

3. The integrator of claim 2, wherein said integration capacitor is charged to a predefined voltage during said reset mode.

4. A method of resetting an integrator comprising temporarily removing an integration capacitor and replacing said integration capacitor with a reset capacitor during a reset operation of said integrator.

5. The method of claim 4, further comprising charging said integration capacitor to a predefined voltage during said reset operation.

6. The method of claim 4, wherein temporarily removing said integration capacitor and replacing said integration capacitor with said reset capacitor is repeated one or more times.

7. A delta-sigma modulator having a plurality of integration stages, wherein at least one of said integration stages comprises a first capacitor for integration and a second capacitor to replace the first capacitor in resetting said at least one integration stage.

8. A differential integrator, comprising a pair of normal integration capacitors and a pair of reset integration capacitors, wherein said normal integration capacitors are rotated out of the integrator and the reset integration capacitors are rotated into the integrator to reset the integrator.

9. A circuit for resetting a state variable output of an integrator, comprising:
   a plurality of integration switches, wherein said integrator operates in a normal mode when said plurality of integration switches are closed;

a plurality of reset switches, wherein said plurality of reset switches are open when said plurality of integration switches are closed; and at least one reset capacitor, wherein said reset capacitor replaces an integration capacitor between an input and an output of said integrator when said plurality of reset switches are closed and said plurality of integration switches are open.

10. A microphone, comprising a circuit for resetting a state variable output of at least one integrator, wherein said at least one integrator comprises a first capacitor for integration and a second capacitor to replace the first capacitor in resetting said at least one integrator.

11. A microphone, comprising:

a transducer, a delta-sigma modulator, coupled to said transducer; and means for maintaining said delta-sigma modulator in a stable state.

12. The microphone of claim 11, wherein said means for maintaining said delta-sigma modulator in a stable state comprises a circuit for resetting a state variable output of an integrator of said delta-sigma modulator, comprising:

a plurality of integration switches, wherein said integrator operates in a normal mode when said plurality of integration switches are closed;

a plurality of reset switches, wherein said plurality of reset switches are open when said plurality of integration switches are closed; and at least one reset capacitor, wherein said reset capacitor replaces an integration capacitor between an input and an output of said integrator when said plurality of reset switches are closed and said plurality of integration switches are open.

13. The microphone of claim 12, wherein said means for maintaining said delta-sigma modulator in a stable state further comprises a limiter, coupled between said transducer and said delta-sigma modulator.

* * * * *